United States Patent
Mirajkar et al.

(10) Patent No.: US 9,503,105 B2
(45) Date of Patent: Nov. 22, 2016

(54) PHASE FREQUENCY DETECTOR (PFD) CIRCUIT WITH IMPROVED LOCK TIME

(71) Applicant: Texas Instruments Incorporated, Dallas, TX (US)

(72) Inventors: Peeyoosh Nitin Mirajkar, Maharashtra (IN); Jagdish Chand Goyal, Karnataka (IN); Sankaran Aniruddhan, Tamil Nadu (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/868,785

(22) Filed: Sep. 29, 2015

(65) Prior Publication Data
US 2016/0112055 A1 Apr. 21, 2016

(30) Foreign Application Priority Data
Oct. 20, 2014 (IN) ............................ 5235/CHE/2014

(51) Int. Cl.
*H03L 7/06* (2006.01)
*H03L 7/095* (2006.01)
*H03L 7/089* (2006.01)
*H03L 7/107* (2006.01)

(52) U.S. Cl.
CPC ............. *H03L 7/095* (2013.01); *H03L 7/089* (2013.01); *H03L 7/1072* (2013.01); *H03L 7/1077* (2013.01)

(58) Field of Classification Search
USPC .................................. 327/147–149, 156–158
See application file for complete search history.

(56) References Cited

U.S. PATENT DOCUMENTS

| | | |
|---|---|---|
| 2003/0025538 A1 | 2/2003 | Bisanti et al. |
| 2005/0122174 A1 | 6/2005 | Moyal et al. |
| 2006/0071716 A1 | 4/2006 | Fang et al. |
| 2009/0075620 A1 | 3/2009 | Aniruddhan et al. |
| 2009/0075689 A1 | 3/2009 | Aniruddhan et al. |
| 2009/0085679 A1 | 4/2009 | Jennings et al. |
| 2009/0267657 A1 | 10/2009 | Sun et al. |
| 2010/0033218 A1* | 2/2010 | Kim ................. H03L 7/0812 327/158 |
| 2010/0074037 A1* | 3/2010 | Lin ..................... G11C 7/20 365/194 |
| 2011/0221494 A1* | 9/2011 | Chen ................... H03L 3/00 327/157 |
| 2012/0319786 A1 | 12/2012 | Kumar et al. |
| 2013/0187690 A1 | 7/2013 | Feng et al. |
| 2016/0112055 A1* | 4/2016 | Mirajkar ............. H03L 7/095 327/158 |

OTHER PUBLICATIONS

Amourah et al., "A Novel OTA-Based Fast Lock PLL", in Custom Integrated Circuits Conf (CICC), 2013 IEEE, 4 pgs., Sep. 2013.
Bashir et al., "Fast Lock Scheme for Phase-Locked Loops", in Custom Integrated Circuits Conference (CICC), 2009 IEEE, pp. 319-322, Sep. 2009.

*Primary Examiner* — Adam Houston
(74) *Attorney, Agent, or Firm* — Tuenlap D. Chan; Frank D. Cimino

(57) ABSTRACT

Described examples include circuitry and methods to control lock time of a phase lock loop (PLL) or other locking circuit, in which a phase frequency detector (PFD) circuit is switched from a first mode to provide a control input signal to a charge pump as a pulse signal having a pulse width corresponding to a phase difference between a reference clock signal and a feedback clock signal to a second mode to hold the control input signal at a constant value for a predetermined time in response to detected cycle slip conditions to enhance loop filter current during frequency transitions to reduce lock time for the locking circuit.

26 Claims, 11 Drawing Sheets

PHASE FREQUENCY DETECTOR (PFD) CIRCUIT WITH IMPROVED LOCK TIME

REFERENCE TO RELATED APPLICATION

This application claims, under 35 U.S.C. §119, priority to, and the benefit of, Indian provisional application number 5235/CHE/2014, entitled "A NOVEL PFD ARCHITECTURE TO HALF THE PLL LOCK TIME USING SAME CHARGE-PUMP CURRENT", and filed in India on Oct. 20, 2014, the entirety of which is hereby incorporated by reference.

TECHNICAL FIELD

The present disclosure relates to clock circuits, and more particularly to phase lock loop and other locking circuits and phase frequency detector (PFD) circuits and methods to improve lock times.

BACKGROUND

Digital and mixed signal circuits such as wireless communications devices often use clock signals. Phase lock loop (PLL) circuits and other locking circuits are used to compare a system clock with a reference clock source, and adjust the frequency of the system clock to ideally match or "lock" the system clock frequency with that of the reference clock source in a closed loop regulation. Such locking circuits typically include a PFD circuit, a charge pump, a loop filter and a voltage controlled oscillator (VCO) in a forward path, as well as a feedback circuit providing the oscillator output signal as feedback for comparison with the reference input by the PFD circuit. The PFD converts phase difference between the reference signal and the feedback signal to voltage pulses, which are used for pumping current into a loop filter to change the VCO control voltage. The PLL operates in a negative feedback, with the VCO output frequency changed so as to reduce the phase error between the reference signal and the VCO output signal.

In certain applications, the reference clock frequency will change (or a feedback divisor factor will change), requiring the PLL circuit to again acquire or lock to the updated reference signal. For example, portable electronic devices are often designed to operate at different or changing reference clock frequencies, and an output signal of a frequency synthesizer circuit employing a PLL may be unreliable during frequency switching. The frequency switching time the locking circuit takes to lock onto an updated reference clock signal is referred to as the lock time, and it is desirable to reduce the lock time. In general, the lock time depends on the PLL loop parameters.

Lock time can be reduced by changing loop filter parameters to adjust the loop bandwidth during frequency switching and by restoring the normal operating bandwidth when the PLL loop nears the locked condition. Another approach uses multiple charge pump circuits that are turned on or off depending on phase errors, where the charge pump current is reduced as the loop nears the locked condition. Other techniques modify a feedback divider value so that the phase error remains small all the time and a current is pumped into the loop filter using an auxiliary charge pump activated by a phase error monitor, where keeping the phase error small reduces ringing of the control voltage near the locked condition. However, these techniques involve additional analog circuitry and/or frequency lock detection circuitry.

SUMMARY

Example locking circuits and methods are described in which a PFD circuit generates a control input signal with a pulse width corresponding to a phase difference between a reference clock signal and a feedback clock signal when the circuit is locked and holds the control input signal at a constant value for a predetermined time in response to detection that the phase difference exceeds a predetermined value to enhance loop filter current during frequency transitions. In certain examples, the PFD circuit operates in two modes. When the phase difference between the reference signal and the feedback signal is less than predetermined value, the PFD operates in a first mode. In the first mode, the PFD circuit generates the output signal with a pulse-width that is proportional to a phase difference between the reference clock signal and the feedback clock signal. When phase difference between reference signal and feedback signal crosses a predetermined value, the PFD operates in second mode. In the second mode, the PFD circuit holds its output signal constant, for example, at a high level, for a predetermined time. Described examples facilitate reduced lock time without requiring auxiliary charge pumps or other added analog circuitry, and without modified feedback divider values or adjustment to loop filter components.

DETAILED DESCRIPTION

Figure 1:
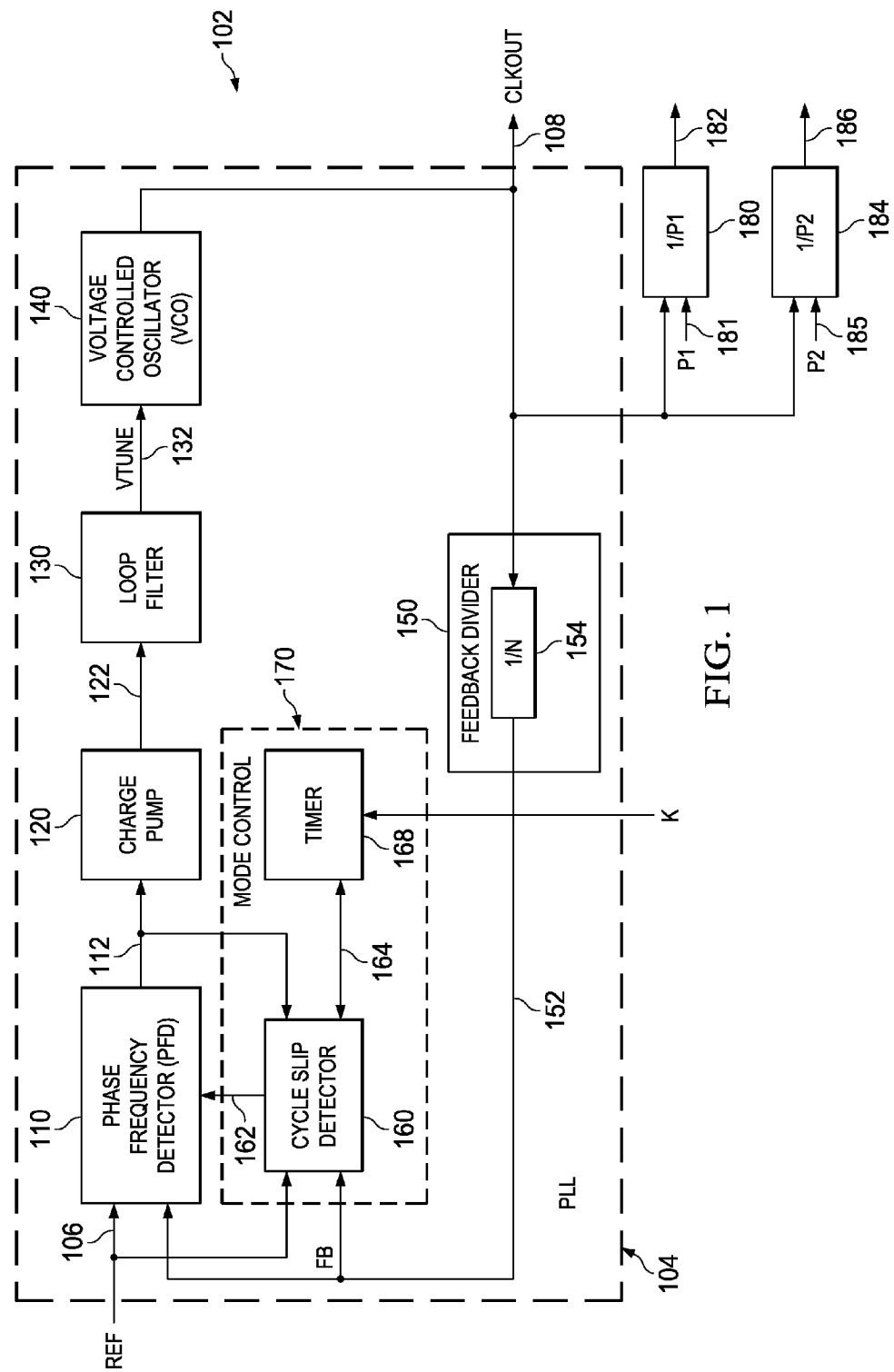
FIG. 1 is a schematic diagram of an example integrated circuit providing a phase lock loop (PLL) with a phase frequency detector (PFD) and a mode control circuit to improve lock time of the PLL.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical connection or combinations thereof. For example, if a first device couples to or is coupled with a second device, that connection may be through a direct electrical connection, or through an indirect electrical connection via one or more intervening devices and connections.

Referring initially to FIGS. 12-15, FIG. 13 shows a PLL 1300 with a conventional PFD circuit including first and second D-type flip-flops 1302 and 1304 and an AND gate 1306 providing a CLEAR signal to clear the flip-flops 1302 and 1304. The flip-flop 1302 provides an output signal "U" to control an upper switched current source, and the second flip-flop 1304 provides an output signal "D" to operate the lower switched current source. The operation of the charge pump current sources according to the up (U) and down (D) output signals from the flip-flops 1302 and 1304 selectively provides charge pump current $I_{CP}$ to a loop filter to set a tuning voltage output signal $V_{Tune}$. The PLL 1300 includes a tristate PFD with charge pump, loop filter and a VCO 1310, and a feedback circuit 1308 provides a feedback signal FB to the clock input of the lower flip-flop 1304. The PFD in FIG. 13 detects phase and frequency differences between the input signal FB and a reference signal REF using the two D flip-flops 1302 and 1304, as well as the AND gate 1306. Since the data or "d" input of both flip-flop is set to VDD, the flip-flop outputs go high when rising edges on a corresponding clock input occur, and remain high until the CLEAR signal is provided by the AND gate 1306. The AND gate 1306 provides the CLEAR signal when both the U and D signals are high.

Figure 13:
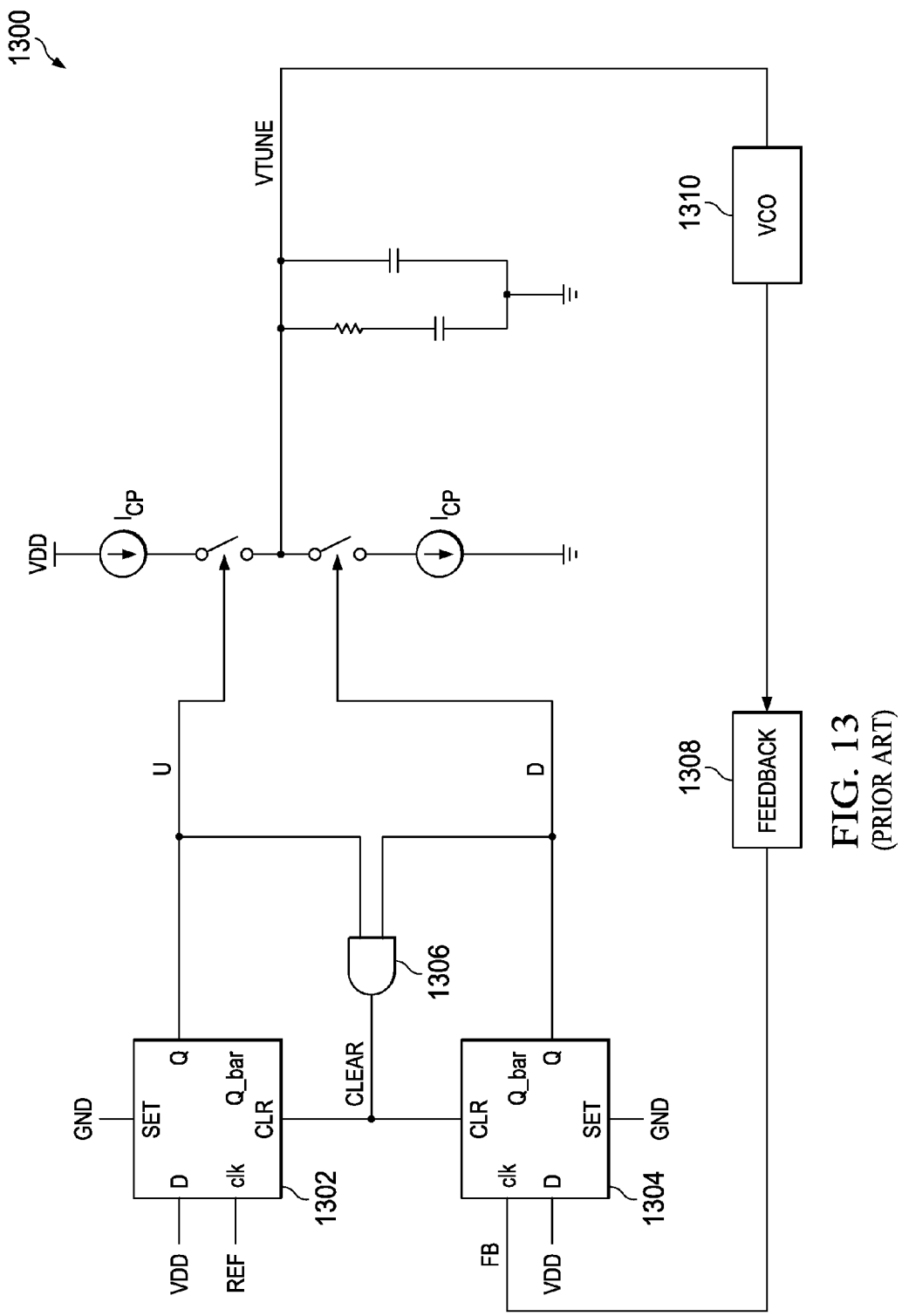
FIG. 13 is a schematic diagram of a PLL with a conventional PFD circuit.
Figure 14:
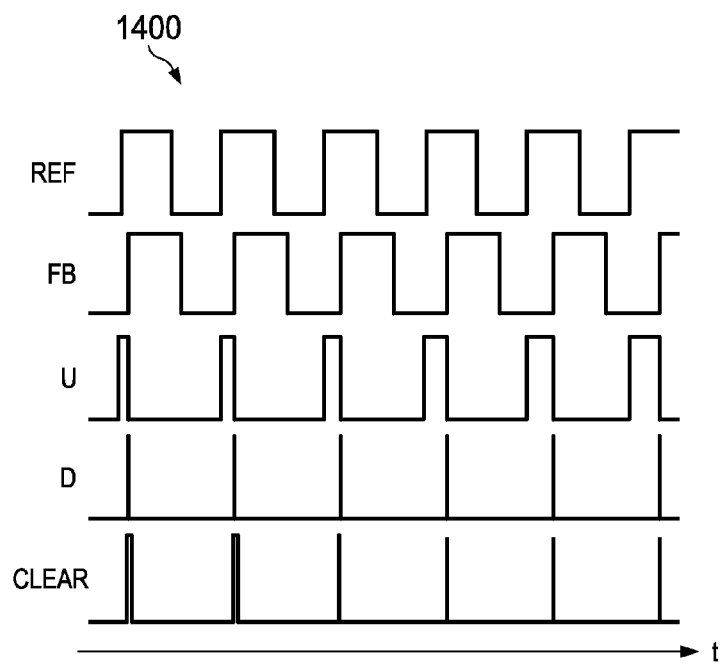
FIG. 14 is a signal diagram of PFD operation in the PLL of FIG. 13 for a small phase difference.

FIG. 14 shows a signal diagram 1400 illustrating PFD REF, FB, U, D and CLEAR signals for operation in the PLL 1300. In general, beginning with both flip-flops 1302 and 1304 at a reset condition, a rising edge on one input, whether REF or FB, will set the corresponding flip-flop 1302 or 1304. In the example of FIG. 14, the reference signal REF initially leads the feedback signal FB. Rising edges on the REF signal initially set the "U" output, and thereafter a rising edge in the FB signal sets the "D" output long enough for the AND gate 1306 to assert the CLEAR signal to clear the flip-flops 1302 and 1304 until the next rising edge of either the REF or the FB signal. FIG. 14 shows conditions where the phase difference is relatively small. Where a frequency step is small compared to the PLL bandwidth, cycle slips do not occur, and the output of the PFD will be proportional to the input phase difference. In this condition, the "D" output is high for very small period, and the output "U is high for the time difference between two rising edges on the REF and FB signals. The pulse-width of the differential output of the PFD of FIG. 13 is generally proportional to phase difference between the REF and FB signals in the conditions shown in FIG. 14. When the PLL is locked, the widths of the "U" and "D" outputs are ideally equal.

Figure 15:
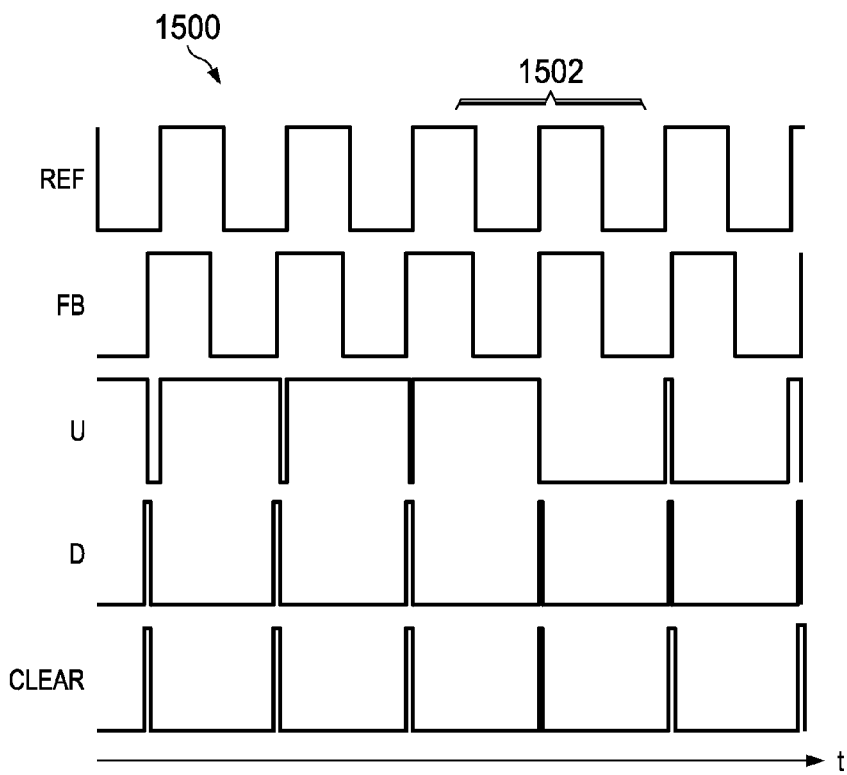
FIG. 15 is a signal diagram of PFD operation in the PLL of FIG. 13 during and after a cycle slip condition.

As seen initially in FIG. 15, the phase difference increases. Eventually, the phase difference passes 22t in FIG. 15, a cycle slip condition occurs at 1502. As initially shown in FIG. 15, as the phase difference between inputs increases, the PFD output increases, and the widths of the "U" pulses increase. The PFD in FIG. 13 compares the phase difference between the REF and FB input signals. However, when the phase difference crosses $2\pi$ as in FIG. 15, the PH) output (e.g., the width of the "U" in this example) pulse drops to a very small value. In this condition, the PFD of FIG. 13 misses one edge on the REF signal, and thereafter compares the next edge of REF with FB. This is called a cycle slip condition in the PLL. Importantly, the PFD output, and in this case the pulse width of the "U" output signal, drops significantly following the cycle slip condition compared with immediately preceding the cycle slip condition. Stated differently, the width of the "U" output pulse becomes very narrow after the cycle slip occurs, even though the phase difference between the REF and FB signals has increased beyond $2\pi$. As a result, the current provided by the charge pump to the loop filter of the PLL is significantly reduced after the cycle slip occurs, which increases the lock time for the PLL to recover. In one example, shown in the signal diagram 1200 of FIG. 12, for example, the average loop filter current 1202 is only about half the maximum value while the PLL in FIG. 13 is recovering from a cycle slip condition.

As previously mentioned, various approaches to addressing this problem have not provided a good solution. In particular, changing loop filter parameters to adjust the loop bandwidth during frequency switching requires additional analog filter components, including circuits to detect cycle slip conditions and extra switching circuits in the loop filter. Adding extra charge pump circuitry for use during cycle slip recovery can improve lock time, but extra analog circuitry is required, and power consumption increases. Also, additional cost and circuit size results from approaches that modify the feedback divider value to improve lock time.

Figure 2:
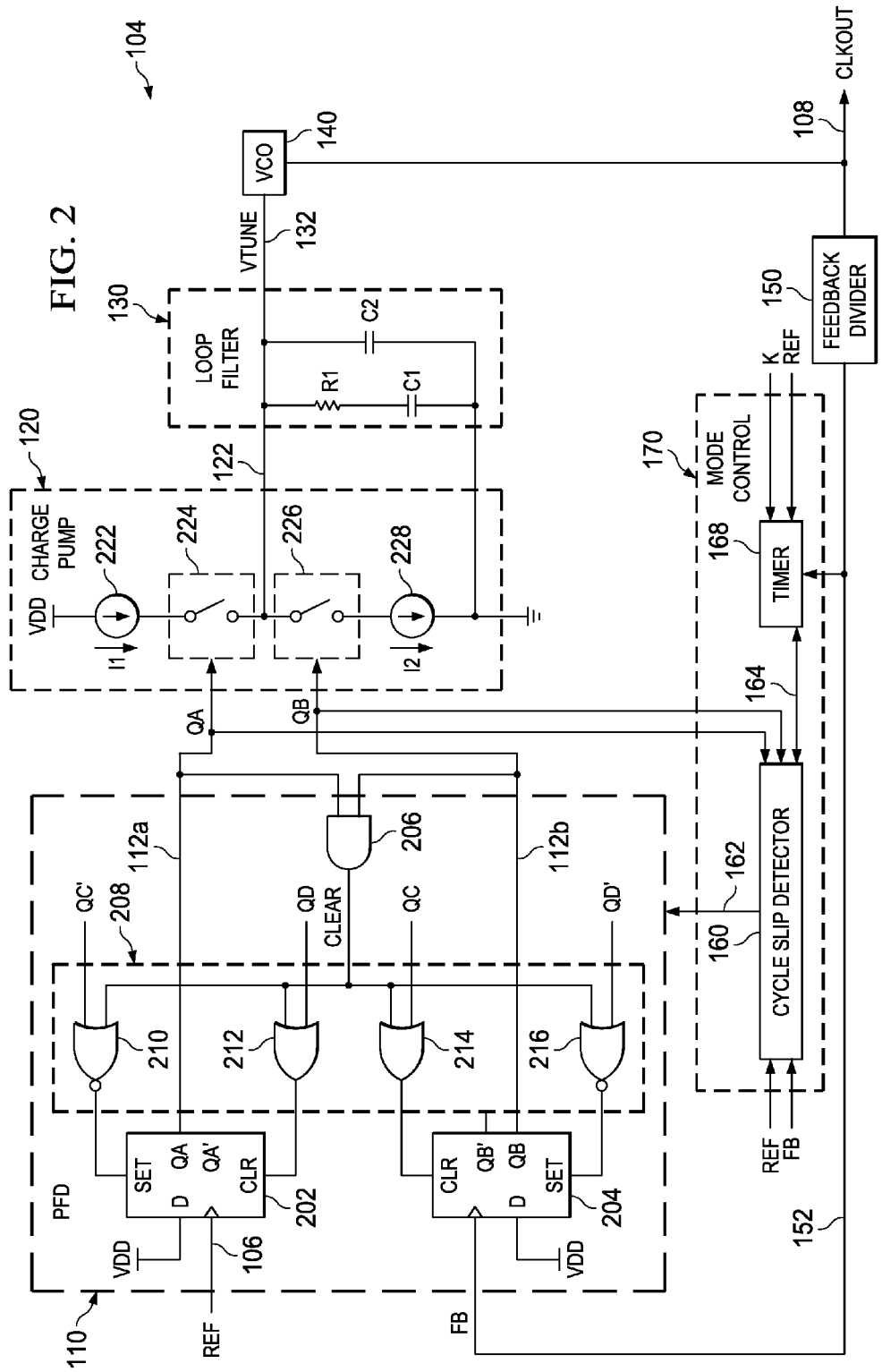
FIG. 2 is a schematic diagram showing further details of the PFD, mode control, charge pump and loop filter circuits in the PLL of FIG. 1.
Figure 3:
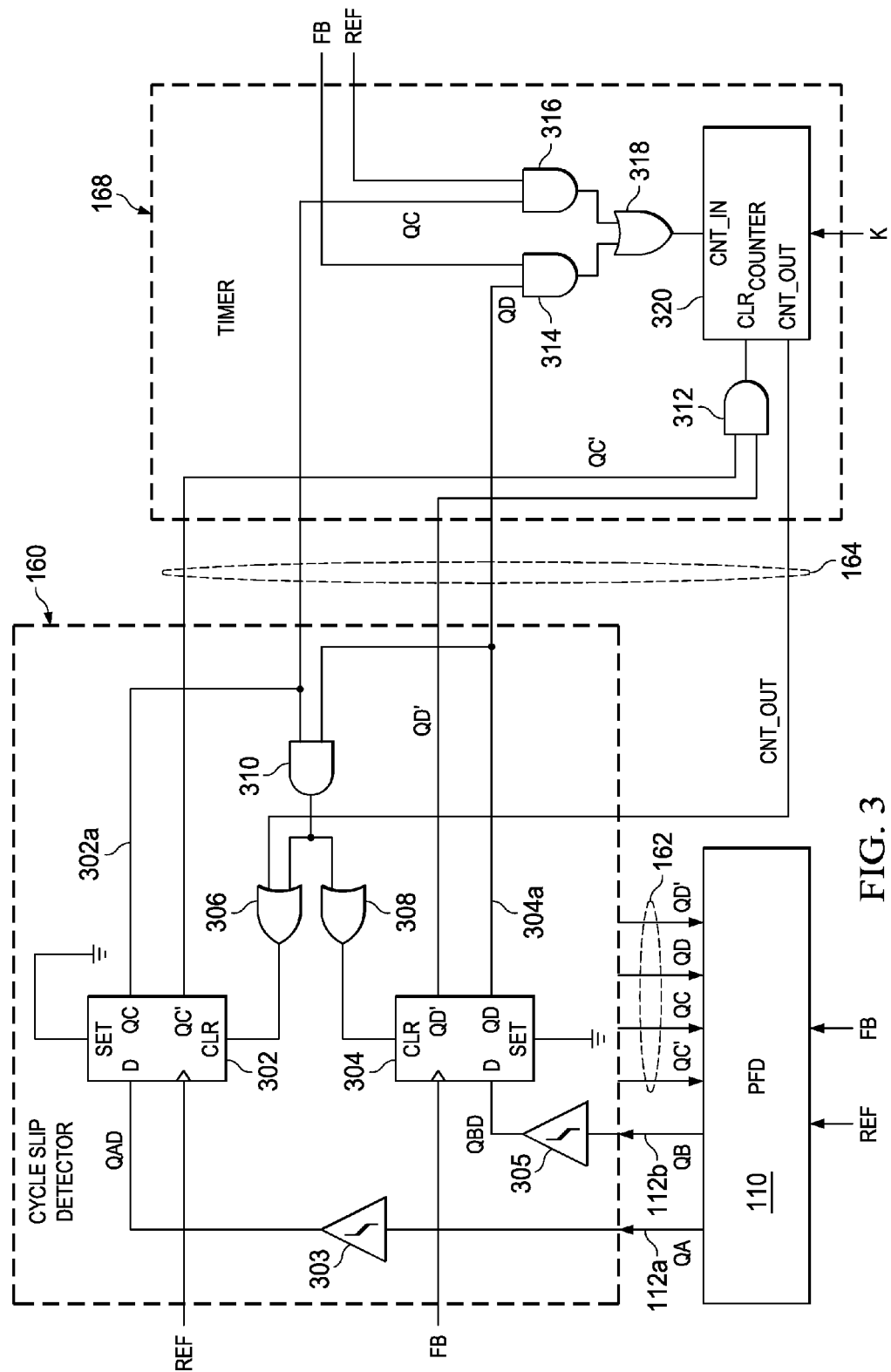
FIG. 3 is a schematic diagram showing details of example cycle slip detector and timer circuits.

Referring now to FIGS. 1-3, presently disclosed examples implement locking circuits 104 in the form of a phase locked loop (PLL) circuit. Various concepts of the present disclosure can be employed in any suitable form of locking circuit, including without limitation a PLL circuit as illustrated and described below, a delay lock loop (DLL) circuit, a frequency lock loop (FLL) or other circuit that facilitates locking of an output clock signal to a primary reference clock. Also, any suitable oscillator control circuit 120 can be used, including without limitation a charge pump circuit (with or without corresponding low pass filter) as illustrated and described herein, as well as digital signals provided to a digital to analog converter (DAC), controls to counters in a DLL type primary locking circuit, etc. for providing an input signal or signals or value to a controlled oscillator, such as a voltage controlled oscillator (VCO) as shown in the described examples.

FIGS. 1-3 show an integrated circuit example 104 providing a PLL output 108 for generating a system clock output signal CLKOUT according to a reference clock signal REF and a feedback clock signal FB derived from the PLL output clock signal CLKOUT. The example of FIG. 1 shows the PLL IC or circuit 104 is implemented in a host circuit or host system 102, where the PLL circuit 104 includes a phase frequency detector (PFD) circuit 110 and a mode control circuit 170 to improve the lock time of the PLL 104. The PLL 104 in FIGS. 1-3 includes a controlled oscillator, such as a voltage controlled oscillator (VCO) 140 providing the clock signal CLKOUT at the output 108 according to a control voltage signal VTUNE. A feedback circuit 150 includes an output 152 that provides the feedback clock signal FB at least partially according to the oscillator output clock signal CLKOUT. In certain examples, the feedback circuit 150 is a divider circuit including a 1/N divider 154 with an output 152 providing the feedback clock signal FB as an input to the PFD circuit 110 based on division of the CLKOUT signal by an integer number "N". In some examples, the integer divisor value N is adjustable. The host system 102 may include one or more further divider circuits 180, 184 to provide divided clock signals 182, 186 at lower frequencies for use in the host system 102. As shown in FIG. 1, for instance, a first divider circuit 180 divides the clock signal 108 by a first integer value P1, and the divider circuit 180 may receive the divisor value 181 as an input, e.g., from another component of the host system 102. Similarly, the second divider circuit 184 may receive a second divisor value P2 as an input 185.

As shown in FIGS. 1 and 2, the PLL 104 has a forward circuit path including a loop filter circuit 130 with an impedance providing a low pass filter formed by a resistor R1 and capacitors C1 and C2. The loop filter circuit example 130 includes a capacitor C2 connected between the control output terminal 132 and a circuit ground, as well as resistor R1 in series with a capacitor C1 in parallel with capacitor C2. The loop filter circuit 130 includes an output 132 to provide the control voltage signal VTUNE to the VCO 140 according to a current signal (e.g., I1, I2 in FIG. 2) received from an output 122 of a charge pump circuit 120. The charge pump circuit 120 provides the current signal I1, I2 according to a control input signal. In the example of FIG. 2, the charge pump circuit 120 includes a first current source 222 coupled with a first (e.g., positive) constant voltage node VDD to provide a current I1, as well as a first switch 224 operated according to a control input signal "QA" to selectively provide the current signal I1 to the output 122 of the charge pump 120. In addition, the charge pump circuit 120 includes a second current source 228 providing a current signal I2 to a ground or second constant voltage node, with a second switch 226 to selectively connect the second current source 228 with the charge pump output 122 according to a second control input signal "QB".

The PFD circuit 110 in the example of FIG. 2 includes an output 112 with first and second output lines 112a and 112b. The lines 112a and 112b generate and provide control input signals QA and QB to the switches 224 and 226 to selectively connect the current sources 222 and 228 to the output 122 of the charge pump 120. In a first mode, the PFD 110 provides the QA and QB signals at the outputs 112a and 112b according to the PLL reference clock signal REF and the feedback clock signal FB. Various different circuit implementations can be used in certain examples to provide the PFD circuit 110. In the example of FIG. 2, first and second D flip-flops 202 and 204 and an AND gate 206 are used. The reference clock input 106 is coupled with the clock input of the flip-flop 202, and the feedback clock signal FB from the divider output 152 is coupled with the clock input of the flip-flop 204. The data (D) inputs of the flip-flops 202 and 204 are coupled with a positive constant voltage node VDD. The flip-flops 202 and 204 are reset by the active (high) signal CLEAR from the output of the AND gate 206 through a logic circuit 208 including OR gates 212 and 214, as well as NOR gates 210 and 216. The inputs of the AND gate 206 are connected to the QA and QB signals on PFD output lines 112a and 112b to receive the output signals QA and QB of the respective flip-flops 202 and 204.

Other forms and configurations of PFD circuits 110 can be used. In certain examples, the PFD circuit 110 generates a single control input signal and provides the signal to the charge pump circuit 120, which has a (variable) pulse width in the first mode and which is held to a constant value in a second mode. In other examples, the PFD provides a digital value to operate a DAC to provide a control input voltage VTUNE to the VCO 140.

In the first mode, the PFD circuit 110 of FIG. 2 generates the QA and QB control input signals at the outputs 112a and 112b to operate the charge pump circuit 120 based on comparison of the first reference clock 106 with the PLL feedback clock signal 152. In the first mode, one of the QA and QB signals has a pulse width corresponding to a phase difference $\Delta\phi$ between a reference clock signal REF and the feedback clock signal FB to control the charge pump circuit 120 to operate a controlled oscillator circuit 140 of a phase lock loop 104 when the phase difference $\Delta\phi$ is less than a predetermined value (e.g., $2\pi$ in one example). In a second mode, as described further below, the PFD circuit 110 holds or maintains at least one of the control input signals QA, QB at a constant value for a predetermined time K in response to the phase difference $\Delta\phi$ exceeding the predetermined value. Examples using a predetermined value of $2\pi$ advantageously identify cycle slip conditions where the output or feedback signals CLKOUT, FB of the locking circuit 104 are not properly locked to the reference signal REF.

The charge pump circuit 120 operates according to the control input signals QA and QB to selectively increase, decrease or maintain a control voltage VTUNE provided at the loop filter output 132 to the VCO 140 according to the phase difference $\Delta\phi$. In this example, the charge pump current signal or signals I1 and I2 charge or discharge the capacitors of the loop filter circuit 130 to generate the control voltage VTUNE. The charge pump 120 provides the control voltage output 122 according to the received QA and QB control input signals by selective operation of the switch circuits 224 and 226 to connect the corresponding current sources 222 and 228 to the output terminal 132. By performing this operation, the control voltage VTUNE at the loop filter output 132 is selectively increased or decreased according to the relative phase relationship between the corresponding reference and feedback clock signals REF and FB.

Figure 4:
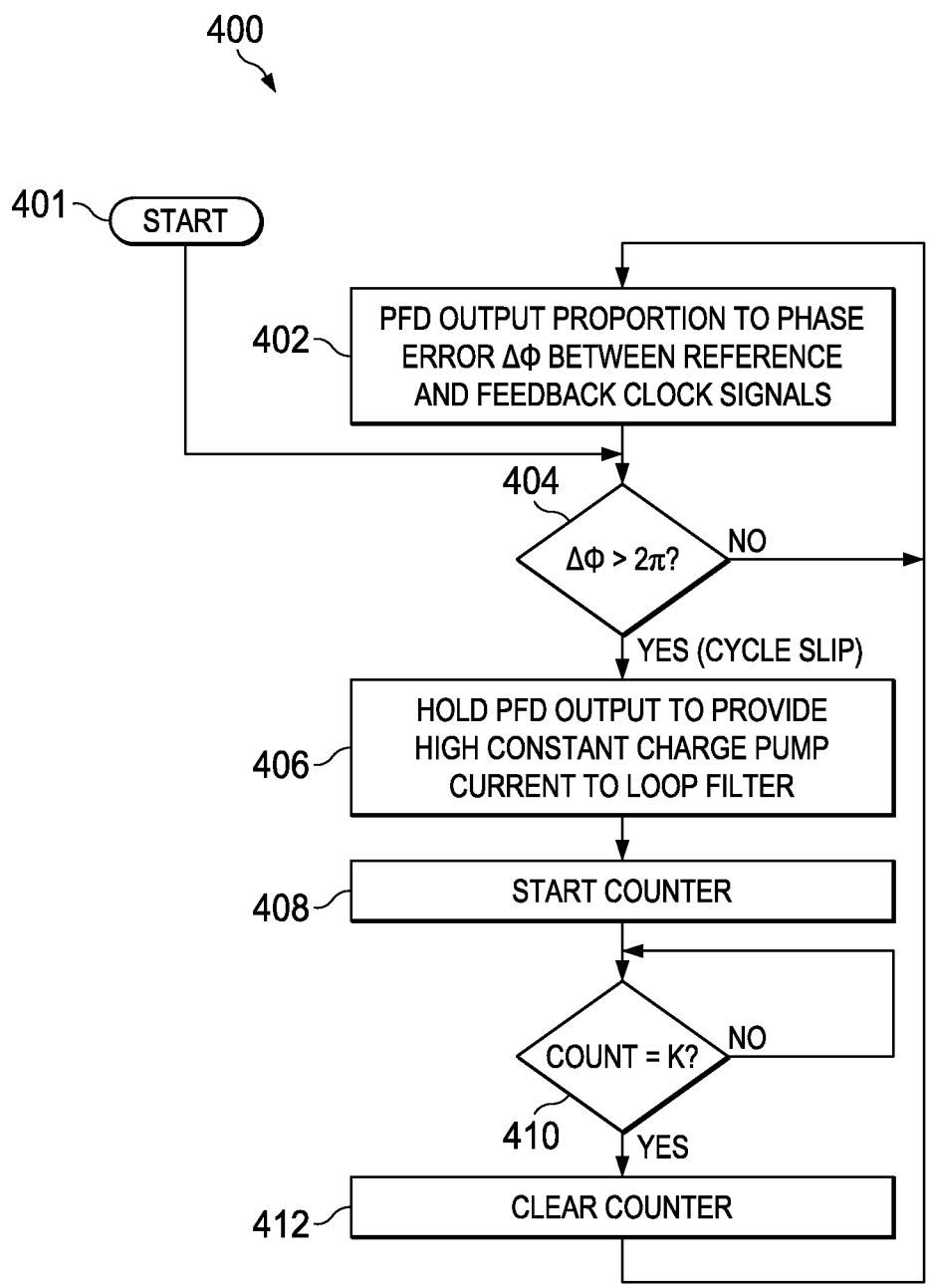
FIG. 4 is a flow diagram of an example method to control PLL lock time.
Figure 5:
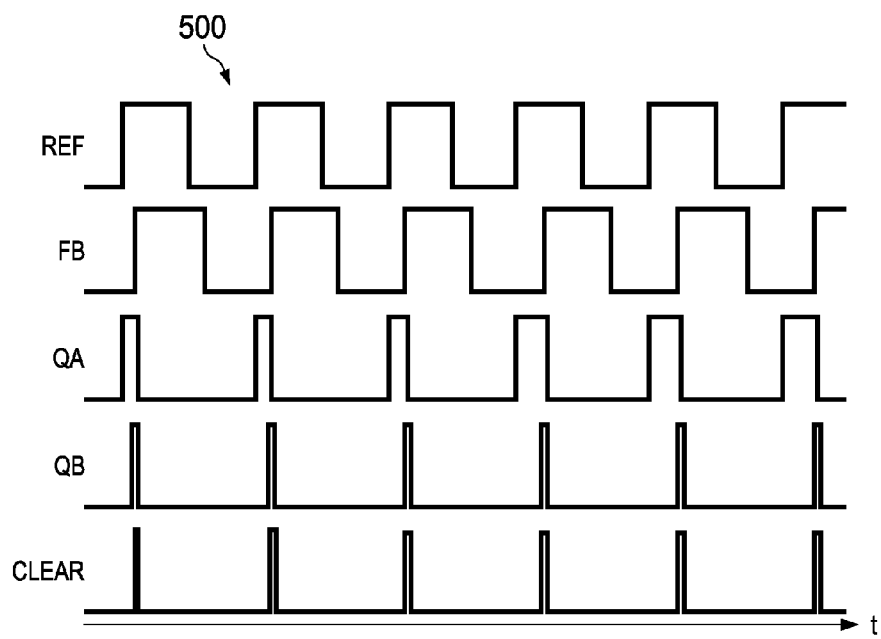
FIG. 5 is a signal diagram of PH) operation for an increasing phase difference between reference and feedback clock signals.
Figure 6:
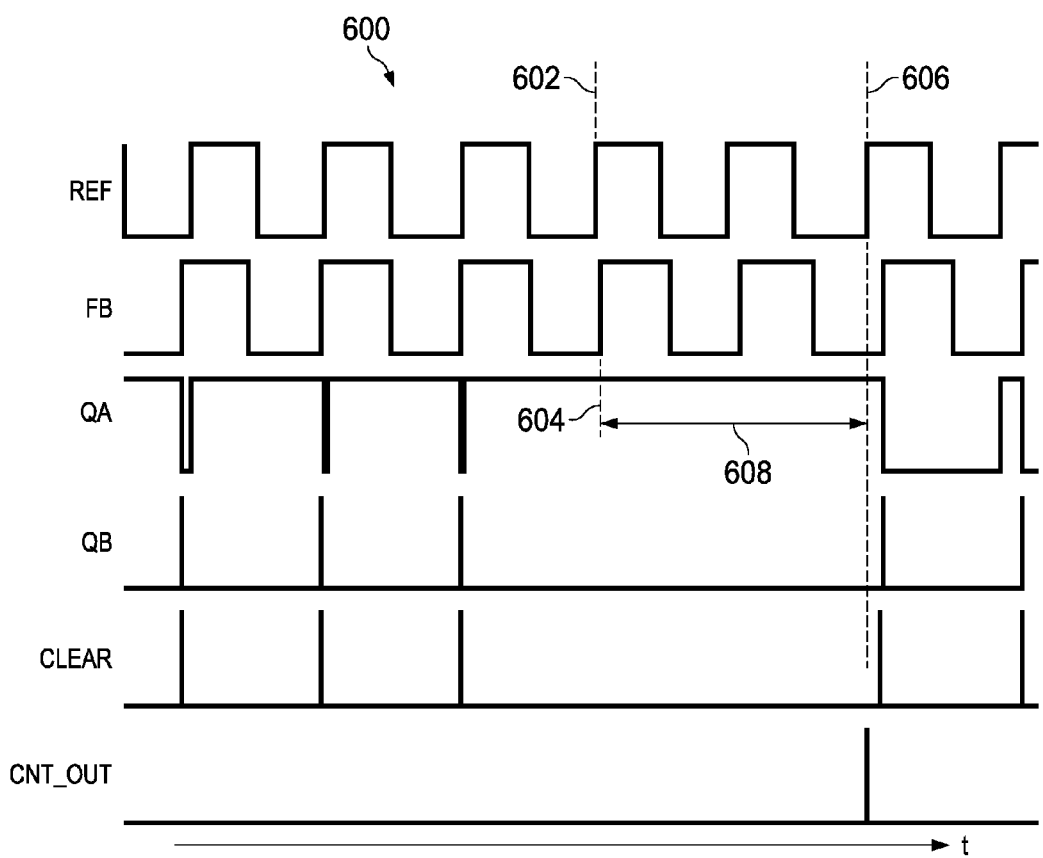
FIG. 6 is a signal diagram of cycle slip operation of the PLL with the PFD circuit holding the output constant for a predetermined time after a detected cycle slip condition.

FIG. 4 shows a method 400 to control a lock time (e.g., lock time 904 in FIG. 9 below) of the PLL 104. In this example, the PLL circuit 104 operates with the PFD circuit 110 in one of two modes according to the magnitude of the phase difference $\Delta\phi$ between the REF and FB signals. In particular, when the phase difference $\Delta\phi$ is less than a predetermined value (e.g., a in one embodiment), the PFD circuit 110 operates to regulate the output clock signal CLKOUT by selective adjustment of the VCO tuning voltage VTUNE according to the phase difference between the REF and FB clock signals. The signal diagram 500 in FIG. 5 shows waveform examples of REF, FB, QA, QB and CLEAR signals for operation of the PLL 104 in the first mode for a phase difference $\Delta\phi$ between the reference and feedback clock signals that is less than the predetermined value. The signal diagram 600 in FIG. 6 shows these signal waveforms in the PLL 104 during a cycle slip condition in which the phase difference $\Delta\phi$ exceeds $2\pi$, indicating that the PLL 104 is not locked. In contrast, the proper regulation of the CLKOUT and FE signals with the REF signal indicates that the locking circuit 104 is locked.

As shown in FIG. 4, the method 400 starts at 401 before initially providing an output. At step 404, the PLL 104 determines whether the phase difference Δϕ exceeds a predetermined value, such as 2π in this example. If it does not (NO at step 404), the PLL 104 operates in the first mode at step 402, with the PLL 104 regulating around locked operation. In the first mode, the PFD circuit 110 provides the QA and QB signals as pulse signals each having a pulse width corresponding to a leading or lagging phase difference Δϕ between the signals REF and FB. The CLEAR signal operates to clear the flip-flops 202 and 204 (FIG. 2) when both QA and QB are high in each cycle of the REF signal.

The signal waveforms of FIG. 5 illustrate an example in which the leading edge of the REF signal leads the leading edge of the FB signal, and the phase difference is increasing. The PFD 110 provides the control input signal QA to initially increase the VCO input voltage VTUNE by applying a signal pulse to turn on the switch 224, VTUNE will stop increasing since the QB signal closes the switch 226 to redirect the current away from the loop filter. The subsequent low going edge of the CLEAR signal terminates the pulses in each cycle. In this manner, the control voltage VTUNE is steadily increased in order to increase the output frequency of the oscillator output clock signal CLKOUT and the corresponding feedback signal FB tends to align in phase with the REF signal by closed loop regulation. Similar operations can be performed where the reference signal REF lags the feedback signal FB. In a closed loop fashion of the first mode, the PLL circuit 104 operates at step 402 in FIG. 4 to lock the signal at the VCO output 108 with the reference clock received at the input 106. The PFD circuit 110 operates in the first mode to generate a control input signal (e.g., QA, QB) as a pulse signal with a pulse width corresponding to the phase difference (Δϕ) between the REF and FB clock signals. As seen in FIG. 5, the phase difference between REF and FB is steadily increasing, with a corresponding increase in the pulse width of the QA signal. In this first mode, the signals in FIG. 5 are similar to those discussed above in the signal diagram 1400 in FIG. 14.

FIG. 6 shows a further increase in the phase difference Δϕ past the example predetermined value of 2π (YES at step 404 in FIG. 4), and the resulting operation of the PFD circuit of FIG. 2 in order to hold the QA and QB signals for a predetermined time. In this situation, the cycle slip detector 160 of the mode control circuit 170 (FIGS. 1-3) detects consecutive edges of a given one of the REF and FB signals. In the example of FIG. 6, for instance, the detector circuit 160 receives two rising (leading) edges of the REF signal with no intervening CLEAR signal, indicating that the feedback signal FB is not within 2π radians of the REF signal and thus, the PLL 104 has slipped a cycle (not locked). The second pulse edge in this example occurs at 602 in FIG. 6. In response to detecting this cycle slip condition, the detector circuit 160 provides at least one timer enable signal 164 to the timer circuit 168. In the illustrated example of FIG. 3, the cycle slip detector 160 provides the QC signal to the gate 214 of the PFD circuit 110 in FIG. 2 which clears the flip-flop 204 controlling the QB signal. Receipt of this timer enable signal 164 (QC) inhibits the CLEAR signal from the AND gate 206 and places the PFD circuit 110 in the second mode. This holds the QA and QB signals for the predetermined time 608 even if a subsequent pulse edge is detected in the FB signal at 604. The QA and QB signals are held constant until a timer complete signal CNT_OUT is received at 606 from the timer 168. The timer circuit 168 provides the timer complete signal CNT_OUT to the detector circuit 160 a predetermined time 608 (e.g., represented by the counter value K) after receiving the timer enable signal 164 from the detector circuit 160. When the CNT_OUT signal is asserted by the timer circuit 168, flip-flop 204 is enabled. The next rising edge on the FB signal resets both the flip-flops 202 and 204 and both QA and QB are high. This causes the CLEAR signal to be asserted and the circuit resumes operation in the first mode. In one example shown in FIG. 3, the timer circuit 168 includes a counter circuit 320 to change (e.g., increase or decrease) a count value in response to the detection of consecutive edges of the given one of the reference clock signal REF or the feedback clock signal FB. The timer circuit 168 in this example provides the timer complete signal CNT_OUT to notify the detector circuit 160 when the count value reaches a threshold value K. In one example, the threshold value K is adjustable.

Returning to FIG. 4, in the second mode (YES at step 404), the PFD circuit 110 generates one or more of the control input signals (e.g., QA, QB) with a constant value to hold the PFD output at step 406. In one example, this second operating mode effectively sets the charge pump current signal to a generally constant high value in order to drive the loop filter 130. The timer circuit 168 begins counting clock cycles using the timer circuit 320 at step 408, and asserts the CNT_OUT signal at step 412 in response to the counter reaching K (YES at step 410). The method 400 then returns to the first operating mode at step 402 as previously described. The count value of the timer 168 may increase or decrease in different implementations. Any suitable timer circuit 168 can be used for providing a timer complete signal (e.g., CNT_OUT) at/upon a predetermined time after receiving a timer enable signal 164, where the predetermined time is adjustable in certain examples. As described further below in connection with FIGS. 10 and 11, a higher value K produces slightly higher average filter current and a longer timer cycle time until the PLL 104 locks, whereas smaller K values result in shorter mode switch cycles with similar lock time at a slightly lower average loop filter current level.

The delay circuits 303 and 305 in FIG. 3 provide a delay between the signals QA or QB and the corresponding data input signaling to the detector flip-flops 302 and 304. In certain implementations, the main PFD circuit 110 in FIG. 2 has a finite reset width, and during a reset time, the PFD 110 is insensitive to rising edges at its inputs. For examples in which the reference signal REF leads the feedback signal FB and the phase difference is slightly below 2π, the first edge of the FB signal follows the first edge of the REF signal. After a rising edge on the FB signal, the PFD circuit 110 enters into a reset window, and a second edge of the REF signal follows a first edge of the REF signal immediately or shortly thereafter. During the second REF signal edge, the PFD circuit 110 is in the reset window and this second REF signal edge is not acknowledged, leading to a cycle slip. The delay buffer circuit 303 of the cycle slip detector circuit 160 ensures that a rising edge during this reset window is detected and the PFD output is made high after the reset window is over, and the PFD circuit 110 switches to the second operating mode. In this manner, the example circuit switches modes when the phase difference crosses 2π− (reset_width/Time period of reference). The circuit thus detects a rising edge during a finite reset window and avoids cycle slip occurrences by switching to the second mode of operation.

In the described examples, the average loop filter current is enhanced in the second mode by holding the control input signal or signals from the PFD circuit 110 after a cycle slip condition is detected in which the PLL 104 is not locked, such as during a frequency switching operation of the host system 102. The exemplary PLL 104 includes a mode control circuit 170 to control the operating mode of the PFD circuit 110. In the described examples, the mode control circuit 170 places the PFD circuit 110 in the first mode when the phase difference Δϕ between the reference clock signal REF and the feedback clock signal FB is less than a predetermined value, such as 2π. In addition, in response to detecting that the phase difference Δϕ exceeds the predetermined value (e.g., Δϕ>2π), the mode control circuit 170 places the PFD circuit 110 in the second mode (e.g., a "hold" mode) for a predetermined time K. As seen in FIG. 1, the mode control circuit 170 provides one or more signals 162 to the PFD circuit 110 to control the operating modes. The mode control circuit 170 receives the reference and feedback clock signals REF and FB along with one or more signals or values from the PFD circuit 110 in order to detect phase difference deviations for example, transitions in Δϕ above the predetermined value.

As seen in FIGS. 2 and 3, the mode control circuit 170 includes a cycle slip detector circuit 160 that provides one or more control signals 162 to the logic circuit 208 of the PFD circuit 110, including QC and QD timer enable signals. The timer circuit 168 exchanges one or more control signals 164 with the cycle slip detector 160. In one example, the detector circuit 160 provides at least one timer enable signal 164 (e.g., QC or QD) to the timer circuit 168 in response to the detection of consecutive edges of a given one of the reference clock signal REF or the feedback clock signal FB. The detection of consecutive edges on one of the clock signals REF or FB indicates that the phase difference (e.g., Δϕ) exceeds a predetermined value. For example, a phase difference Δϕ greater than 2π indicates a cycle slip condition, and that the PLL circuit 104 is not locked to the current frequency of the REF input signal received on the input 106. This can occur, for instance, during frequency switching of the host system 102. In this situation, the PLL circuit 104 of the presently described examples changes the operating mode of the PFD circuit 110 in order to hold the output signal or signals (e.g., QA, QB) at a generally constant value in order to enhance the current provided from the charge pump circuit 120 to the loop filter circuit 130. The selective holding operation reduces lock time for the PLL circuit 104 for locking onto the updated reference signal REF. In particular, the selective holding operation by the PFD circuit 110 can reduce the lock time without using any additional or auxiliary charge pump circuitry, without modifying the divider value N of the feedback circuit 150, and without modifying the frequency response characteristics of the loop filter circuit 130. Accordingly, the described examples present a significant advance over previous attempts to improve lock time in PLL circuits. The implementations of the disclosed examples can be used alone or in combination with any of these other techniques in certain implementations.

The detector circuit 160 in one example provides one or more control signals 162 to place the PFD circuit 162 in the second or hold mode in response to the detection of consecutive edges of the REF or FB signal. In addition, the timer circuit 168 provides the timer complete signal CNT_OUT to the cycle slip detector circuit 160 a predetermined time after receiving the timer enable signal or signals 164 from the detector circuit 160. In certain embodiments, moreover, the predetermined time is adjustable. In certain examples, the timer circuit 168 includes a counter (e.g., counter circuit 320 in FIG. 3), and the timer circuit 168 operates according to a signal or value "K" as shown in FIGS. 1-3. In some examples, the value K represents a counter value. The counter 320 of the timer circuit 168 counts a number of cycles of the reference clock signal REF and/or of the feedback signal FB following detection of the consecutive edges of the REF or FB signal. Once the counter increases K times, the timer circuit 168 provides the CNT_OUT signal to the cycle slip detector circuit 168. The detector circuit 168 then causes the PFD circuit 110 to resume the first mode operation, so that the PFD outputs QA and QB are generated as pulses having a pulse width based on the phase difference Δϕ. In this manner, the PFD 110 selectively holds or freezes the signal or signals at its output 112 for a predetermined time (e.g., set by the counter value K) following the detection of cycle slip conditions or other conditions in which Δϕ, exceeds a predetermined value. This example enhances the loop filter current provided by the charge pump circuit 120 for quickly locking the PLL circuit 104 into the reference signal REF, and after the predetermined time resumes operation of the PLL circuit 104 in the first mode.

Figure 7:
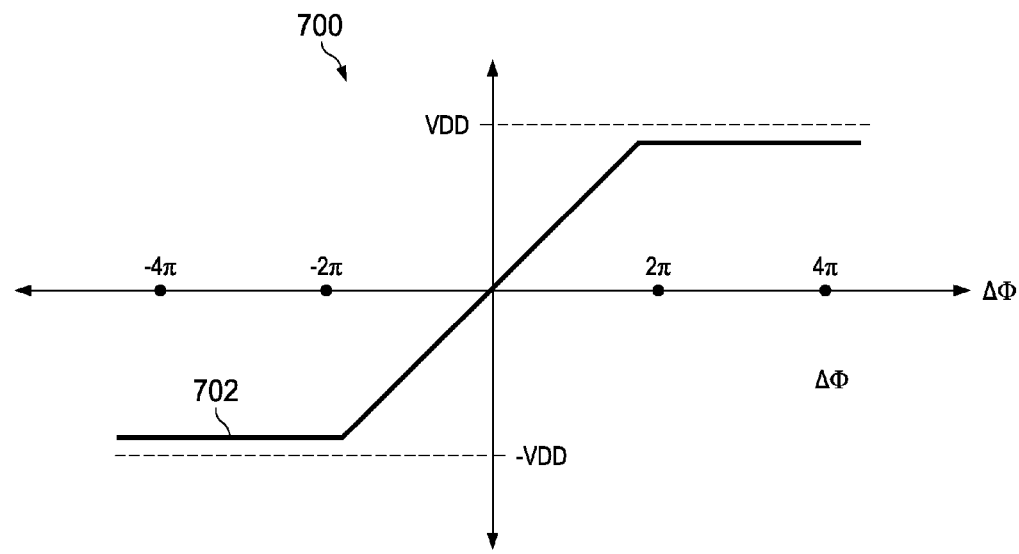
FIG. 7 is a signal diagram of a characteristic curve of the PFD circuit in FIGS. 1-3.
Figure 8:
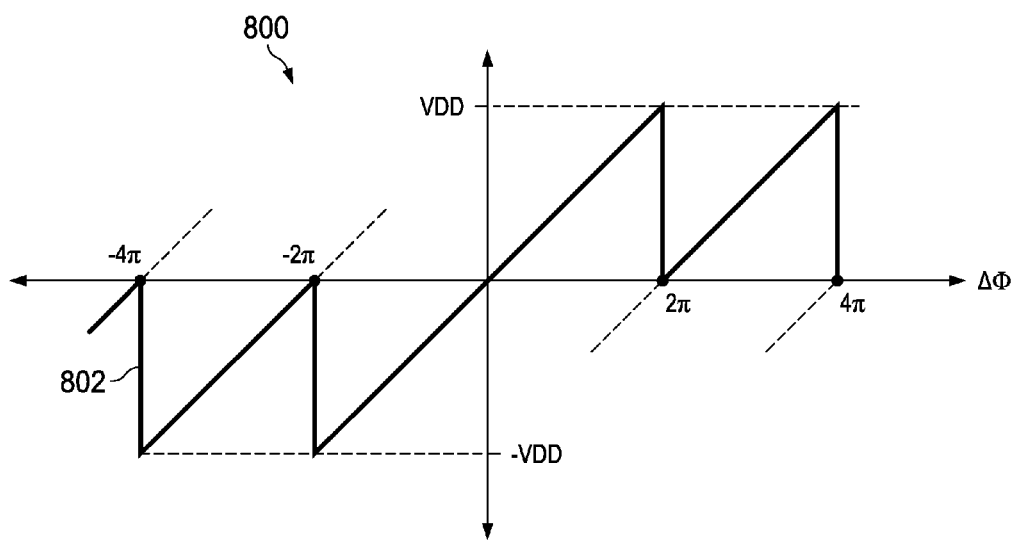
FIG. 8 is a signal diagram of a conventional PFD characteristic curve.

Referring also to FIGS. 7-12, a signal diagram 700 in FIG. 7 shows a waveform 702 of the PFD circuit 110 in FIGS. 1-3. The waveform 702 represents the average PFD output as a function of phase difference Δϕ. The average PFD output has a linear portion in the first mode when the phase difference Δϕ (positive leading or negative lagging) is less than plus or minus 2π, and the average PFD output is held at a constant value in response to the phase difference exceeding plus or minus 2π. The signal diagram 800 of FIG. 8 shows a waveform 802 of a conventional PFD which exhibits cycle slip conditions when Δϕ≤2π, with hysteresis shown in dashed lines in the signal diagram 800 corresponding to the conventional PLL shown in FIG. 13. As the absolute phase error crosses 2π in FIG. 8, the phase error perceived by the conventional PFD is the remainder of phase error and +/−2π. If the phase difference Δϕ increases beyond 2π, the average PFD output wraps down to zero and reduces the width of corresponding PFD pulse. This is referred to as a cycle slip. The PFD output drives the charge pump using a narrow pulse width since the PFD sees only a small phase error. As a result, the current pumped into the loop filter after a cycle slip is less than what is expected by a linear analysis, and thus the PLL behaves in a nonlinear fashion with an increasing lock time of the PLL.

Figure 9:
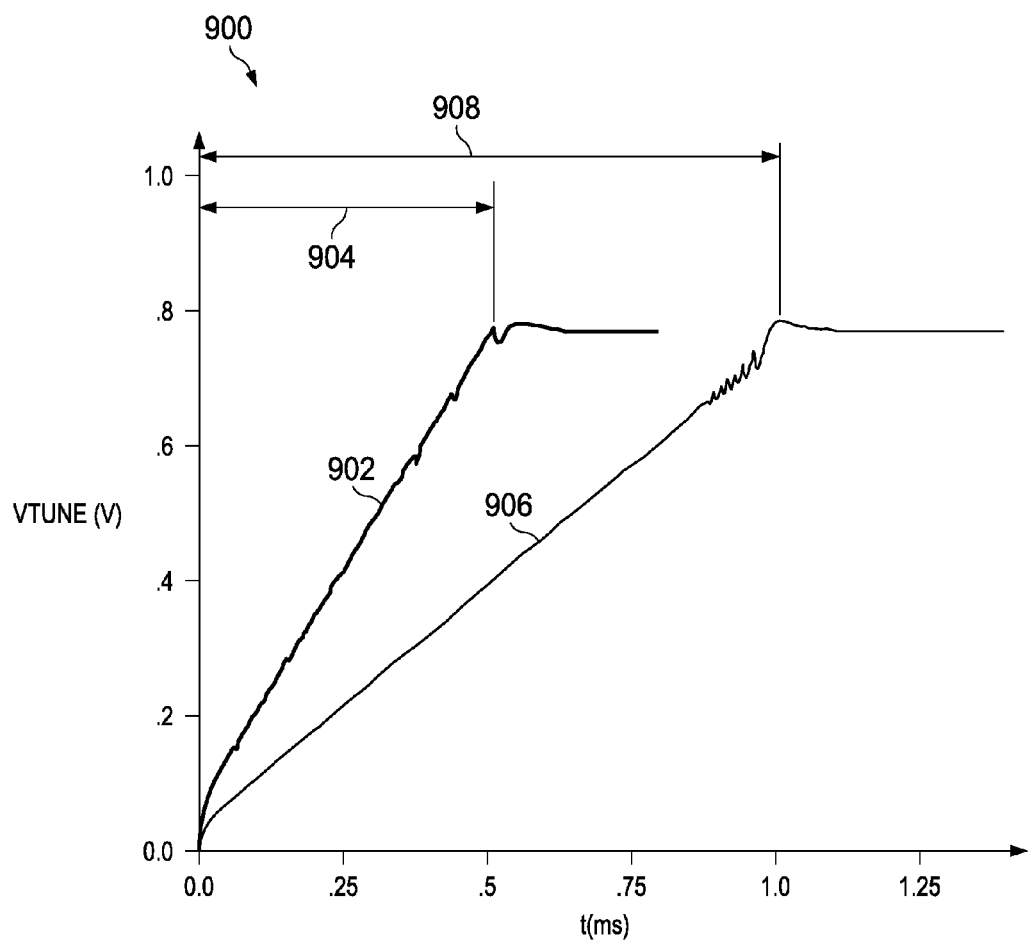
FIG. 9 is a signal diagram of voltage controlled oscillator (VCO) tuning or control voltage as a function of time showing improved lock time performance.

FIG. 9 shows a signal diagram 900 illustrating the VCO control voltage VTUNE curve 902 in the illustrated PLL of FIGS. 1-3, as well as a VCO input voltage curve 906 for a conventional PLL (not shown) as a function of time beginning with an unlocked condition. In this example, the PLL 104 achieves a lock time 904 that is approximately half the lock time 908 of the conventional PLL. As seen in FIG. 9, the circuits and techniques of the described examples greatly improve lock time performance of the PLL circuit 104 without auxiliary charge pump circuitry, without modifying the feedback divisor "N" and without modifying the loop filter circuit 130.

Figure 10:
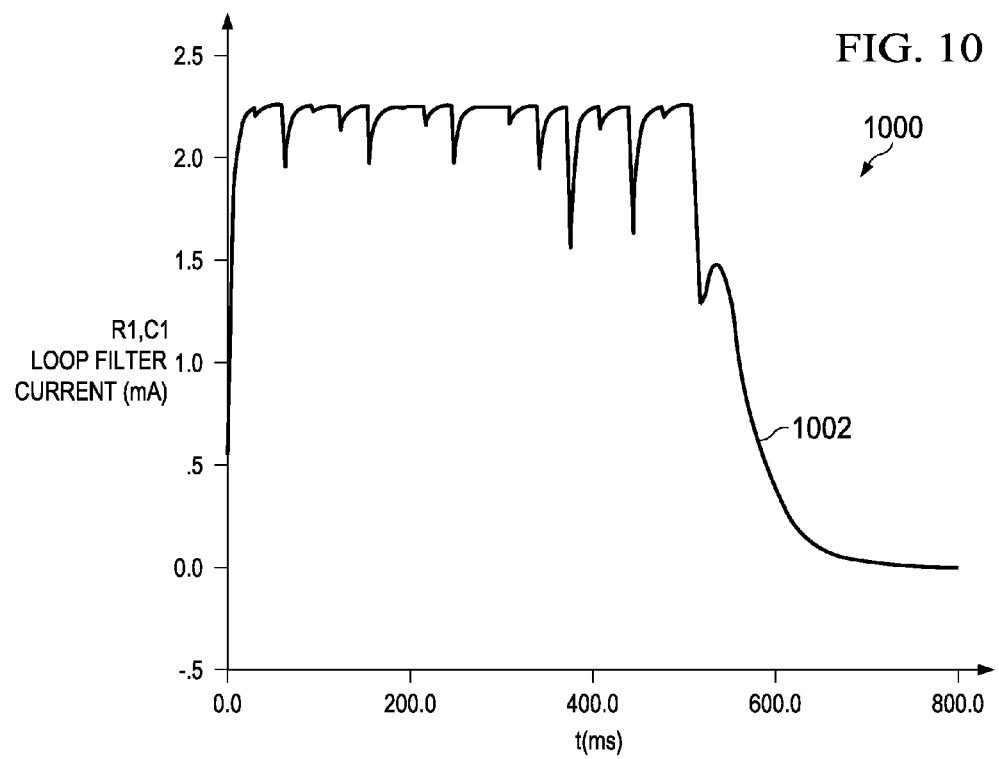
FIG. 10 is a signal diagram of loop filter current as a function of time during locking using a first predetermined time value in the mode control circuit of FIGS. 1-3.
Figure 11:
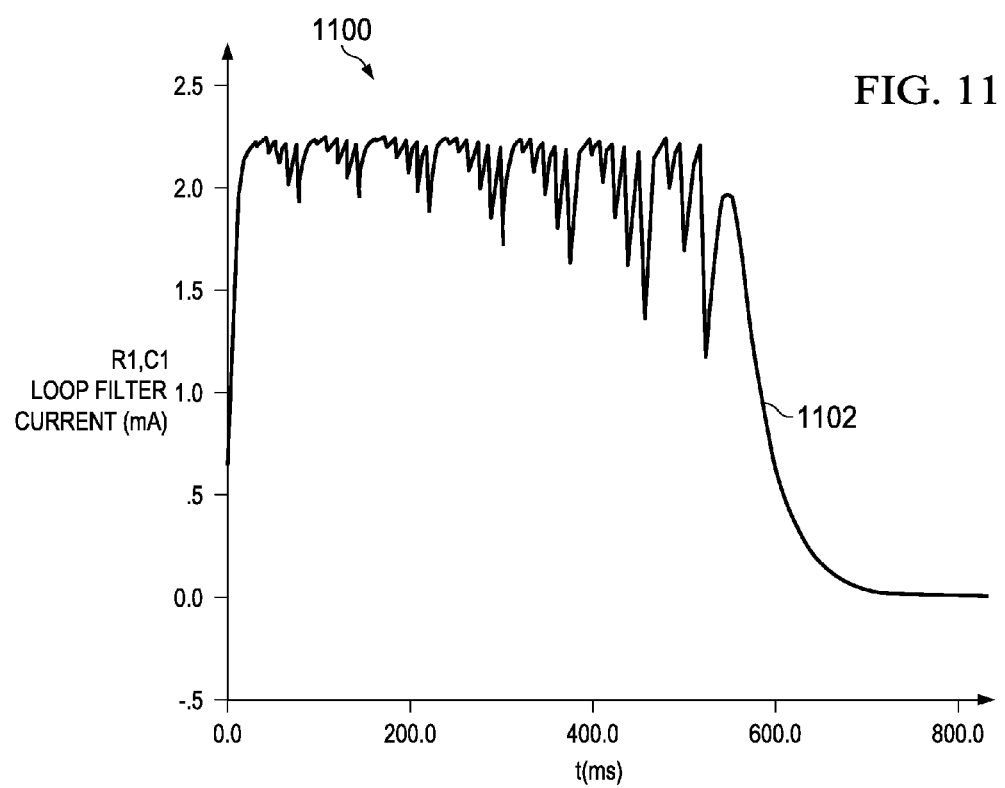
FIG. 11 is a signal diagram of loop filter current as a function of time during locking using a second shorter predetermined time value in the mode control circuit of FIGS. 1-3.

The signal diagrams 1000 and 1100 in FIGS. 10 and 11 respectively show loop filter current curves 1002 and 1102 as a function of time during locking using a different predetermined time values in the mode control circuit of FIGS. 1-3. The current curves 1002 and 1102 represent the current through R1 and C1 in FIG. 2. In these examples, the charge pump circuit 120 provides a maximum of around 2.5 mA, and the curves 1002 and 1102 provide significantly more than half the maximum value during locking. For a longer predetermined time (e.g., higher value K) in FIG. 10, slightly higher average filter current results with a longer timer cycle time until the PLL 104 locks at around 500 mS.

A shorter predetermined time (e.g., smaller K value) results in the curve 1102 of FIG. 11 provides shorter mode switch cycles with similar lock time at a slightly lower average loop filter current level. As seen in FIGS. 10 and 11, the loop filter current is not constant, and instead undergoes dips when the PFD circuit 110 reverts back to operation in the first mode after the counter 320 overflows. This allows the PFD 110 to retain its hysteresis operation at the cost of average current being less than the maximum value. The amount of current dip depends on the time for the next cycle slip (if any) to occur, which in turn depends on the phase difference between the REF and FB signals when the PFD circuit 110 reverts to normal (First) mode operation, and the loop bandwidth. As the frequency difference between REF and FB decreases, the amount of time required for cycle slip increases, thereby increasing the amount of current dip. Higher counter values K reduce the number of dips and the average current increases (FIG. 10), at the cost of less frequent sampling of locking condition (i.e., the PFD circuit 110 is holding its output value regardless of the phase difference during the predetermined time). This raises the possibility of a further cycle slip occurring just before the loop locks for a high count value K, and the VTUNE value may rise above its steady-state value, in turn increasing lock time. For lower values of K (e.g., FIG. 11), the dips are more frequent, thus slightly reducing the average current provided to the loop filter 130. The amount of dip in each successive cycle increases as shown in the curve 1102, and the loop corrects the phase error slowly.

Figure 12:
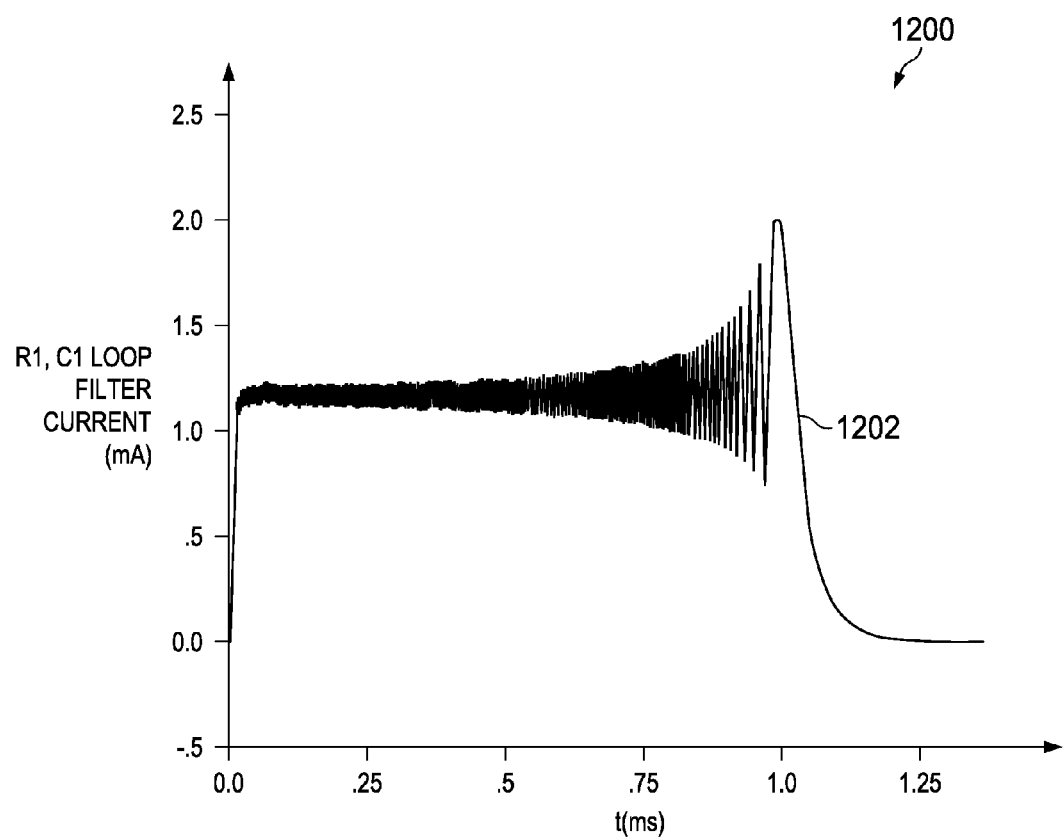
FIG. 12 is a signal diagram of conventional loop filter current as a function of time.

FIG. 12 shows a signal diagram 1200 of conventional loop filter current 1202 as a function of time during locking. As seen in the conventional case of FIG. 12, the lock time exceeds 1000 mS and the average loop filter current is only about half the maximum value. In a conventional PLL, the number of cycle slips depends on the PLL bandwidth and the magnitude of the input reference frequency change. Without wishing to be tied to any particular theory, as the number of cycle slips increases, the probability that the phase difference is between 0 to $2\pi$ is equiprobable, and the average output of PFD driving the charge pump is approximately 0.5-0.55 times the maximum output.

Returning to FIGS. 2 and 3, the first PFD flip-flop 202 includes a clock input that receives the reference clock signal REF, and a first PFD flip-flop output 112*a* that generates and provides a first control input signal QA to the charge pump circuit 120. The clock input of the second PFD flip-flop 204 receives the feedback clock signal FB, and the second PFD flip-flop output 112*b* provides the second control input signal QB to the charge pump 120. The charge pump 120 provides the current signal I1, I2 to the loop filter 130 to set the VCO input voltage VTUNE according to the control input signals QA and QB. As seen in FIG. 3, the cycle slip detector circuit 160 in one example includes a first detector flip-flop 302 with a clock input that receives the REF signal, and a first detector flip-flop data (D) input receiving a delayed signal QAD based on the QA signal through a first delay buffer or delay circuit 303. The first detector flip-flop 302 also includes a first detector flip-flop output 302*a* that provides a first timer enable signal QC to the timer circuit 168 to load the predetermined count value in counter and start counter in response to detection of consecutive edges of the reference clock signal REF. The detector circuit 160 includes a second detector flip-flop 304 with a clock input that receives the FB signal, and a second detector flip-flop data input which receives a delayed signal QBD based on the QB signal through a second delay buffer or delay circuit 305. The flip-flop 304 also includes a second detector flip-flop output 304*a* that provides a second timer enable signal QD to the timer circuit 168 to load the predetermined count value in counter and start counter in response to of the detected consecutive edges of the feedback clock signal FB. In this manner, the detector circuit operates for detecting cycle slips and holding the PFD output for a predetermined time for both leading and lagging situations.

The PFD circuit in FIG. 2 provides additional logic circuitry 208 receiving signals QC, QC', QD and QD' (162 in FIG. 3) from the mode control circuit 170. The example detector circuit 160 in FIG. 3 includes OR gates 306 and 308 and an AND gate 310 to selectively clear the flip-flops 302 and 304 in response to receiving a timer complete signal CNT_OUT from the timer circuit 168 or cycle slip detection signal from cycle slip detector. The timer circuit 168 of FIG. 3 uses timer enable signals 164 (e.g., QC, QC', QD and QD') along with the REF and FB signals to selectively increase (or decrease) the counter 320 in response to detection of consecutive pulse edges on the REF or FB signals using AND gates 314 and 316 and an OR gate 318. The AND gate 314 receives the QD and FB signals for changing the counter value in response to consecutive pulse edges detected on the FB signal. The AND gate 316 changes the counter in response to consecutive pulse edges detected on the REF signal. An AND gate 312 in the timer circuit 168 selectively clears the counter 320 when the inverse signals QC' and QD' are both logic high.

The logic circuitry in the PFD circuit 110 (FIG. 2) and in the detector and timer circuits 160, 168 in FIG. 3 operates to detect cycle slips whenever the phase difference $\Delta\phi$ is more than $2\pi$. This logic circuitry also sets the PFD mode to hold the PFD outputs QA and/or QB constant until the counter is changed K times. If the loop is far from the locked condition, for example, during startup or for significant frequency changes in the REF signal, the phase difference $\Delta\phi$ can cross $2\pi$ multiple times (e.g., as seen in FIGS. 10 and 11). The PFD output signal QA will be kept high for a predetermined time after the initially detected cycle slip. The disclosed examples hold the PFD output to provide nearly the maximum charge pump output current irrespective of the input reference and feedback signals REF and FB for this predetermined time in response to the phase difference $\Delta\phi$ crossing the predetermined value (e.g., $2\pi$). The predetermined time period (e.g., counter value K) can be empirically determined, or may be adjusted for different applications or based on current operating conditions in various example implementations.

The circuitry in FIGS. 2 and 3 uses four flip-flops 202, 204, 302 and 304, as well as a counter 320 and various logic gates. Unlike other approaches, the described examples do not require adjustable feedback divider circuitry 150 or adjustable loop filter circuitry 130 or any auxiliary charge pump circuits. In certain examples, adjustable feedback divider circuitry 150, adjustable loop filter circuitry 130, and/or auxiliary charge pump circuits can be used in combination with the mode control circuit 170 and PFD circuit 110. The flip-flops 302 and 304 operate to detect consecutive edges on the REF or FB signals depending on which is leading the other. Assuming the REF signal leads the FB signal, the signal QA goes high in response to a rising edge of the REF signal. This sets the D input of the flip-flop 302 high. The occurrence of consecutive rising edges on the REF signal indicates the phase difference $\Delta\phi$ exceeding $2\pi$, and this extra rising edge sets the flip-flop 302 of the detector circuit 160. To avoid the PFD output (e.g., QA) going low after a rising edge on the FB signal for the predetermined time after this consecutive edge detection, the flip-flop 302 disables the flip-flop 204 and the input signal to the counter circuit 320 (CNT_IN input in FIG. 3) is controlled via the AND gate 316, 314 and the OR gate 318. The counter circuit 320 is enabled in this example when the CLR input from AND gate 312 is low, when either of the signals QC' or QD' is low. The flip-flop 302 output QC going high sets the CLR input of the flip-flop 204 high via gate 214 (FIG. 2) to keep the QB output signal low. The counter 320 counts the specific number of cycles received at the CNT_IN input, and when K such cycles have occurred, the CNT_OUT output goes high. This clears the flip-flop 302, which in turn enables the flip-flop 204 of the PFD circuit 110. Clearing flip-flop 302 also clears the counter output CNT_OUT, and the flip-flops 202 and 204 resume PFD operation in the first mode. Similar operation is implemented for REF lagging FB via the logic circuitry in FIGS. 2 and 3.

Described examples hold the PFD output to a constant state for a predetermined finite period of time independent of its inputs REF and FB in response to detection of the detected phase difference Δφ exceeding 2π or some other predetermined value. This is accomplished in described examples by making one of the PFD flip-flops 202 or 203 insensitive to rising edges for a finite duration of time. As seen in FIGS. 9-11, the average output of the PFD 110 is near maximum during the locking sequence, leading to nearly twice the lock speed (lock time approximately cut in half).

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims. In addition, although a particular feature of the disclosure may have been disclosed with respect to only one of multiple implementations, such feature may be combined with one or more other features of other embodiments as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What is claimed is:

1. A locking circuit to provide a clock output signal according to a reference clock signal, comprising:
    a controlled oscillator including an output to provide an oscillator output clock signal according to a control voltage signal;
    a feedback circuit including a first output to provide a feedback clock signal according to the oscillator output clock signal;
    a loop filter circuit comprising an impedance and a second output to provide the control voltage signal according to a current signal;
    a charge pump circuit including a third output to generate the current signal according to a control input signal; and
    a phase frequency detector (PFD) circuit operative in a first mode to generate the control input signal having a pulse width corresponding to a phase difference between a reference clock signal and the feedback clock signal, and operative in a second mode to generate the control input signal with a constant value; and
    a mode control circuit operative to place the PFD circuit in the first mode when the phase difference between the reference clock signal and the feedback clock signal is less than a predetermined value, and operative in response to the phase difference exceeding the predetermined value to place the PFD circuit in the second mode for a predetermined time.

2. The locking circuit of claim 1, wherein the predetermined value is 2π.

3. The locking circuit of claim 2, wherein the mode control circuit comprises:
    a detector circuit operative to detect consecutive edges of the reference clock signal or the feedback clock signal, the detector circuit operative to provide a timer enable signal in response to detected consecutive edges of the reference clock signal or the feedback clock signal, and the detector circuit operative to selectively place the PFD circuit in the second mode in response to the detected consecutive edges of the reference clock signal or the feedback clock signal until a timer complete signal is received; and
    a timer circuit to provide the timer complete signal to the detector circuit in response to completion of the predetermined time after receiving the timer enable signal from the detector circuit.

4. The locking circuit of claim 3, wherein the timer circuit includes a counter circuit to change a count value in response to the detected consecutive edges of the reference clock signal or the feedback clock signal, and the counter circuit is operative to provide the timer complete signal when the count value reaches a threshold value.

5. The locking circuit of claim 4, wherein the threshold value is adjustable.

6. The locking circuit of claim 3,
    wherein the PFD circuit includes:
        a first PFD flip-flop including a first PFD flip-flop clock input to receive the reference clock signal, and a first PFD flip-flop output to provide a first control input signal to the charge pump circuit, and
        a second PFD flip-flop including a second PFD flip-flop clock input to receive the feedback clock signal, and a second PFD flip-flop output to provide a second control input signal to the charge pump circuit;
    wherein the charge pump circuit generates the current signal according to the first and second control input signals from the first and second PFD flip-flops; and
    wherein the detector circuit includes:
        a first detector flip-flop including a first detector flip-flop clock input to receive the reference clock signal, and a first detector flip-flop output to provide a first timer enable signal to the timer circuit to selectively change the count value in response to the detected consecutive edges of the reference clock signal, and
        a second detector flip-flop including a second detector flip-flop clock input to receive feedback clock signal, and a second detector flip-flop output to provide a second timer enable signal to the timer circuit to selectively change the count value in response to the detected consecutive edges of the feedback clock signal.

7. The locking circuit of claim 6, wherein the first detector flip-flop includes a first detector flip-flop data input, and wherein the second detector flip-flop includes a second detector flip-flop data input, the locking circuit further comprising:
    a first delay circuit receiving the first control input signal from the first PFD flip-flop, the first delay circuit to provide a first delay circuit output signal to the first detector flip-flop data input; and a second delay circuit receiving the second control input signal from the second PFD flip-flop, and the second delay circuit to provide a second delay circuit output signal to the second detector flip-flop data input.

8. The locking circuit of claim 1, wherein the mode control circuit comprises:
   a detector circuit operative to detect consecutive edges of the reference clock signal or the feedback clock signal, the detector circuit operative to provide a timer enable signal in response to detected consecutive edges of the reference clock signal or the feedback clock signal, and the detector circuit operative to selectively place the PFD circuit in the second mode in response to the detected consecutive edges of the reference clock signal or the feedback clock signal until a timer complete signal is received; and
   a timer circuit to provide the timer complete signal to the detector circuit the predetermined time after receiving the timer enable signal from the detector circuit.

9. The locking circuit of claim 8, wherein the timer circuit includes a counter circuit to change a count value in response to the detected consecutive edges of the reference clock signal or the feedback clock signal, and the counter circuit is operative to provide the timer complete signal when the count value reaches a threshold value.

10. The locking circuit of claim 9, wherein the threshold value is adjustable.

11. The locking circuit of claim 8:
    wherein the PFD circuit includes:
       a first PFD flip-flop including a first PFD flip-flop clock input to receive the reference clock signal, and a first PFD flip-flop output to provide a first control input signal to the charge pump circuit, and
       a second PFD flip-flop including a second PFD flip-flop clock input to receive the feedback clock signal, and a second PFD flip-flop output to provide a second control input signal to the charge pump circuit;
    wherein the charge pump circuit generates the current signal according to the first and second control input signals from the first and second PFD flip-flops; and
    wherein the detector circuit includes:
       a first detector flip-flop including a first detector flip-flop clock input to receive the reference clock signal, and a first detector flip-flop output to provide a first timer enable signal to the timer circuit to selectively change the count value in response to the detected consecutive edges of the reference clock signal, and
       a second detector flip-flop including a second detector flip-flop clock input to receive feedback clock signal, and a second detector flip-flop output to provide a second timer enable signal to the timer circuit to selectively change the count value in response to the detected consecutive edges of the feedback clock signal.

12. The locking circuit of claim 11, wherein the first detector flip-flop (302) includes a first detector flip-flop data input (D), and wherein the second detector flip-flop (304) includes a second detector flip-flop data input (D), the locking circuit (104) further comprising:
    a first delay circuit (303) receiving the first control input signal (QA) from the first PFD flip-flop (202), the first delay circuit (303) to provide a first delay circuit output signal (QAD) to the first detector flip-flop data input (D); and a second delay circuit (305) receiving the second control input signal (QB) from the second PFD flip-flop (204), and the second delay circuit (305) to provide a second delay circuit output signal (QBD) to the second detector flip-flop data input (D).

13. The locking circuit of claim 1, wherein the timer circuit includes a counter circuit to change a count value in response to the detected consecutive edges of the reference clock signal or the feedback clock signal, and the counter circuit is operative to provide the timer complete signal when the count value reaches a threshold value.

14. The locking circuit of claim 13, wherein the threshold value is adjustable.

15. The locking circuit of claim 1, wherein the locking circuit is a phase locked loop (PLL).

16. A circuit to control lock time of a locking circuit, the control circuit comprising:
    a phase frequency detector (PFD) circuit to generate first and second control input signals to operate a charge pump circuit to cause the charge pump circuit to drive a controlled oscillator that generates an oscillating output signal of the locking circuit, the PFD circuit including a first PFD flip-flop including a first PFD flip-flop clock input to receive a reference clock signal, and a first PFD flip-flop output to generate the first control input signal, and a second PFD flip-flop including a second PH) flip-flop clock input to receive a feedback clock signal derived from the oscillating output signal, and a second PFD flip-flop output to generate the second control input signal; and
    a control circuit to detect cycle slip conditions in the locking circuit when a phase difference between the reference clock signal and the feedback clock signal exceeds a predetermined value, the control circuit operative to generate a mode control signal in response to a detected cycle slip condition to cause the PFD circuit to hold the first and second control input signals at constant values for a predetermined time.

17. The circuit of claim 16, wherein the control circuit comprises:
    a detector circuit to detect the cycle slip conditions in the locking circuit according to consecutive edges of the reference clock signal or the feedback clock signal, the detector circuit including:
       a first detector flip-flop including a first detector flip-flop clock input to receive the reference clock signal, and a first detector flip-flop output to generate a first mode control signal in response to the detected consecutive edges of the reference clock signal to cause the PFD circuit to hold the first and second control input signals at constant values, and
       a second detector flip-flop including a second detector flip-flop clock input to receive feedback clock signal, and a second detector flip-flop output to generate a second mode control signal in response to the detected consecutive edges of the feedback clock signal to cause the PFD circuit to hold the first and second control input signals at constant values;
    a logic circuit to selectively clear the first and second detector flip-flop outputs in response to receiving a timer complete signal; and
    a timer circuit including a counter circuit to change a count value in response to receiving one of the first and second mode control signals and to provide the timer complete signal when the count value reaches a threshold value.

18. The circuit of claim 17, wherein the threshold value is adjustable.

19. The circuit of claim 16, wherein the predetermined value is $2\pi$.

20. A method to control lock time of a phase lock loop, the method comprising:
generating a control input signal to operate a controlled oscillator circuit of a phase lock loop, the control input signal having a pulse width corresponding to a phase difference between a reference clock signal and a feedback clock signal when the phase difference is less than a predetermined value; and
selectively holding the control input signal at a constant value for a predetermined time in response to the phase difference exceeding the predetermined value.

21. The method of claim 20, comprising adjusting the predetermined time.

22. The method of claim 20, comprising detecting the phase difference exceeding the predetermined value by detecting consecutive edges of the reference clock signal or the feedback clock signal.

23. The method of claim 22, comprising:
starting a timer circuit responsive to detecting consecutive edges of the reference clock signal or the feedback clock signal; and
discontinuing holding the control input signal at the constant value the predetermined time after the timer circuit was started.

24. The method of claim 23, comprising:
starting the timer circuit by enabling a counter responsive to the detected consecutive edges of the reference clock signal or the feedback clock signal; and
discontinuing holding the control input signal at the constant value responsive to a count value of the counter reaching a threshold value.

25. The method of claim 20, comprising:
starting a timer circuit responsive to detecting the phase difference exceeding the predetermined value; and
discontinuing holding the control input signal at the constant value the predetermined time after the timer circuit was started.

26. The method of claim 25, comprising:
starting the timer circuit by enabling a counter responsive to detecting the phase difference exceeding the predetermined value; and
discontinuing holding the control input signal at the constant value responsive to a count value of the counter reaching a threshold value.

* * * * *